United States Patent
Deleonibus

(10) Patent No.: US 7,553,693 B2
(45) Date of Patent: Jun. 30, 2009

(54) METHOD FOR MAKING A FIELD EFFECT TRANSISTOR WITH DIAMOND-LIKE CARBON CHANNEL AND RESULTING TRANSISTOR

(75) Inventor: Simon Deleonibus, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 154 days.

(21) Appl. No.: 10/593,335

(22) PCT Filed: Mar. 25, 2005

(86) PCT No.: PCT/FR2005/000717

§ 371 (c)(1),
(2), (4) Date: Sep. 19, 2006

(87) PCT Pub. No.: WO2005/093794

PCT Pub. Date: Oct. 6, 2005

(65) Prior Publication Data

US 2007/0218600 A1    Sep. 20, 2007

(30) Foreign Application Priority Data

Mar. 25, 2004    (FR) .................................. 04 03073

(51) Int. Cl.
*H01L 21/00* (2006.01)
(52) U.S. Cl. ................. 438/105; 257/77; 257/E21.041; 257/E21.049; 438/151; 438/163
(58) Field of Classification Search ................. 438/105, 438/151, 163, 300; 257/E21.618, 77
See application file for complete search history.

(56) References Cited

U.S. PATENT DOCUMENTS

| | | | |
|---|---|---|---|
| 4,090,289 A * | 5/1978 | Dennard et al. | 438/294 |
| 5,107,315 A | 4/1992 | Kumagai et al. | |
| 5,114,871 A | 5/1992 | Jones | |
| 5,350,944 A | 9/1994 | Geis et al. | |
| 5,455,432 A | 10/1995 | Hartsell et al. | |
| 5,523,588 A | 6/1996 | Nishimura et al. | |
| 6,013,191 A * | 1/2000 | Nasser-Faili et al. | 216/67 |
| 6,025,211 A | 2/2000 | Ishikura et al. | |

(Continued)

FOREIGN PATENT DOCUMENTS

EP    0 343 962    11/1989

(Continued)

*Primary Examiner*—Lex Malsawma
*Assistant Examiner*—Robert Huber
(74) *Attorney, Agent, or Firm*—Oliff & Berridge, PLC

(57) ABSTRACT

The field effect transistor comprises a source and a drain connected by a channel controlled by a gate electrode separated from the channel by a gate insulator. The channel is formed by a diamond-like carbon layer. The method for making the transistor successively comprises deposition of a diamond-like carbon layer on a substrate, deposition of a gate insulating layer and deposition of at least one conducting layer. The conducting layer is etched to form the gate electrode. Then an insulating material is deposited on the flanks of the gate electrode to form a lateral insulator. Then the gate insulating layer is etched and the diamond-like carbon layer is etched so as to delineate the channel. Then a semi-conducting material designed to form the source and a semi-conducting material designed to form the drain are deposited on each side of the channel.

7 Claims, 2 Drawing Sheets

U.S. PATENT DOCUMENTS

| | | | |
|---|---|---|---|
| 6,025,233 A | | 2/2000 | Terasawa |
| 6,091,076 A | * | 7/2000 | Deleonibus .................. 257/24 |
| 6,492,216 B1 | * | 12/2002 | Yeo et al. .................... 438/197 |
| 6,573,565 B2 | * | 6/2003 | Clevenger et al. ........... 257/355 |
| 6,657,223 B1 | | 12/2003 | Wang et al. |
| 7,119,417 B2 | * | 10/2006 | Sorada et al. ............... 257/616 |
| 2001/0000111 A1 | | 4/2001 | Blanchard |
| 2006/0151844 A1 | * | 7/2006 | Avouris et al. .............. 257/411 |

FOREIGN PATENT DOCUMENTS

| JP | A-2002-76369 | 3/2002 |
|---|---|---|
| WO | WO 00/30169 | 5/2000 |

* cited by examiner

METHOD FOR MAKING A FIELD EFFECT TRANSISTOR WITH DIAMOND-LIKE CARBON CHANNEL AND RESULTING TRANSISTOR

BACKGROUND OF THE INVENTION

The invention relates to a method for making a field effect transistor comprising a source and a drain connected by a channel controlled by a gate electrode separated from the channel by a gate insulator, the channel being formed by a diamond-like carbon layer.

STATE OF THE ART

A field effect transistor comprises a source and a drain that are connected by a channel. A gate electrode, separated from the channel by a gate insulator, enables the on or off state of the channel to be controlled. Conventionally, the source, drain and channel of field effect transistors are made from a semi-conducting material, for example silicon.

To produce a CMOS type inverter, a PMOS type transistor and a NMOS type transistor are assembled. Optimum operation of the inverter requires the saturation current in the PMOS transistor to be equal to the saturation current in the NMOS transistor. In a NMOS type transistor, the electric current flowing in the channel is an electron current, whereas in a PMOS type transistor, the electric current flowing in the channel is a hole current. The current is proportional to the mobility of the corresponding charge carriers. The mobility of electrons in silicon being greater than the mobility of holes in silicon, the dimensions of NMOS and PMOS type transistors are adapted so as to obtain equal saturation currents in the NMOS and PMOS transistors. Thus, the PMOS type transistor of a CMOS inverter, for example, has a larger channel width than the channel width of the associated NMOS type transistor. Miniaturization of the CMOS inverter is then limited by the dimensions of the PMOS transistor.

Field effect transistors comprising channels made of diamond are well known. The document U.S. Pat. No. 5,107,315, for example, describes a field effect transistor of metal/insulator/semi-conductor (MIS) type arranged on an insulating layer of diamond formed on a silicon substrate. A layer of P-doped semi-conducting diamond forms a channel. A source and a drain are formed by layers of N-doped semi-conducting diamond. A gate insulator made of diamond is arranged on the channel and a gate electrode is arranged on this gate insulator. The document U.S. Pat. No. 5,107,315 also describes a transistor having an N-doped channel and a P-doped source and drain. Fabrication of the transistor consists in successively making the channel, the source and drain, the gate insulator and the gate. Such a transistor can present stray capacitances between drain and gate and between source and gate, which downgrades the performances of the transistor.

OBJECT OF THE INVENTION

It is one object of the invention to remedy these shortcomings and in particular to enable transistors and logic gates of small dimensions presenting weak stray capacitances to be produced.

According to the invention, this object is achieved by the appended claims and in particular by the fact that the method successively comprises deposition of a diamond-like carbon layer on a substrate,
deposition of an insulating gate layer on the diamond-like carbon layer,
deposition, on the insulating gate layer, of at least one conducting layer and etching of the latter so as to form the gate electrode,
deposition of an insulating material on flanks of the gate electrode to form a lateral insulator,
etching of the gate insulating layer,
etching of the diamond-like carbon layer so as to delineate the channel,
deposition, on each side of the channel, of a semi-conducting material designed to form the source and of a semi-conducting material designed to form the drain.

It is a further object of the invention to provide a transistor obtained by the method according to the invention and a CMOS type logic gate comprising such transistors.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

The field effect transistor according to the invention comprises a channel formed by a diamond-like carbon layer. The channel can be doped by N-type dopants to form a PMOS type transistor or by P-type dopants to form a NMOS type transistor. For a doping of $10^{15}$ atoms per cubic centimeter, the diamond-like carbon has an electron mobility of 1800 $cm^2/Vs$ and a hole mobility of 1800 $cm^2/Vs$ at ambient temperature. Two transistors, respectively NMOS and PMOS type transistors having channels of equal widths, then have identical saturation currents. This enables logic gates to be constructed, for example a CMOS inverter, comprising PMOS and NMOS type transistors having the same dimensions and a surface that is 28% smaller than the surface of a silicon-base CMOS inverter.

Figure 1:
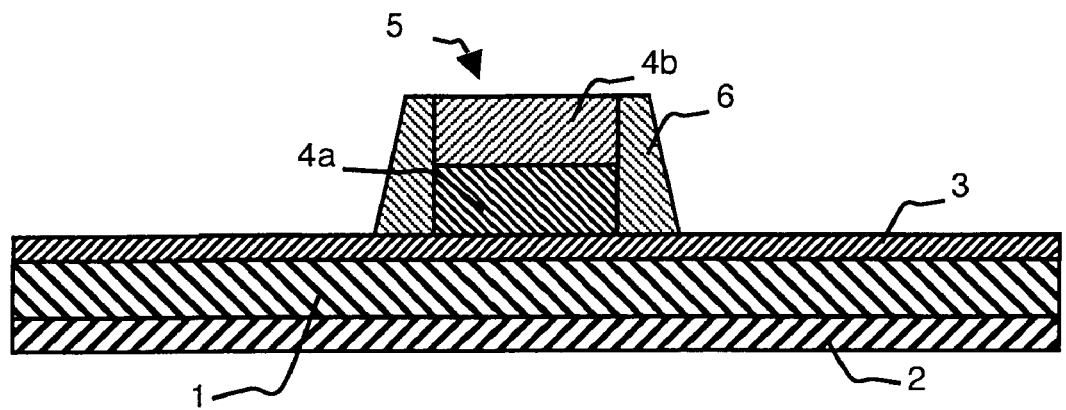
FIGS. 1 to 5 illustrate a particular embodiment of a method for making a transistor according to the invention.

According to the invention, a diamond-like carbon layer 1 is deposited on a substrate 2, as represented in FIG. 1. The substrate can comprise an insulating thin layer on its surface, for example a layer of oxide having a high dielectric constant, for example alumina. Then a gate insulating layer 3 is deposited on the diamond-like carbon layer 1. A conducting layer 4 is then deposited on the gate insulating layer 3. As represented in FIG. 1, the conducting layer 4 can be formed by superposition of a first conducting layer 4a and of a second layer 4b that can be conducting or not, which layer can be used as masking layer for etching or embedding. The conducting layer 4a can be deposited by low-pressure chemical vapor deposition or by epitaxy. An etching step enables the conducting layer 4 to be laterally delineated by means of a mask (not shown) so as to form the gate electrode 5. Then deposition of an insulating material on the flanks of the gate electrode 5 enables a lateral insulator 6 of the gate electrode 5 to be formed. The lateral electrical insulator 6 can be achieved by depositing a layer having a thickness corresponding to the thickness of the conducting layer 4 around the gate electrode 5, followed by etching by means of a mask (not shown).

Figure 2:
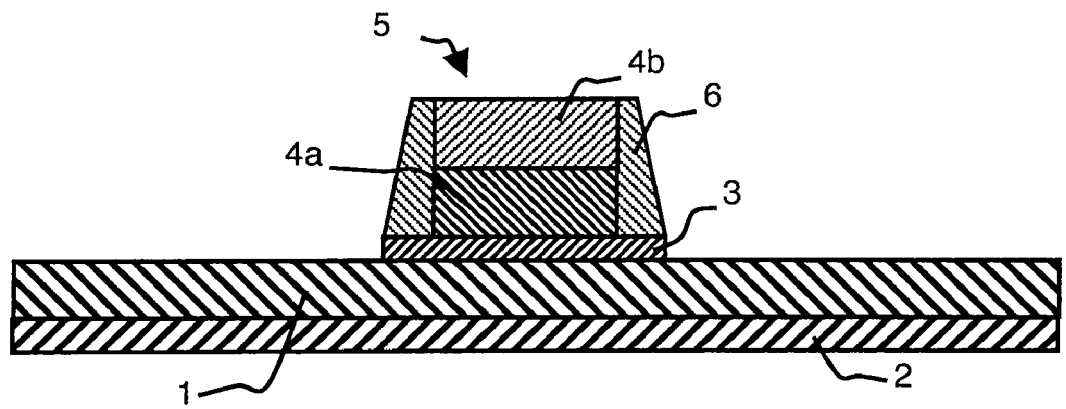

In FIG. 2 etching of the gate insulating layer 3 in the zones of the substrate 2 not covered by the gate electrode 5 and the insulator 6 is represented. This etching can be performed using chlorinated mixtures and a hot cathode type technique.

Figure 3:
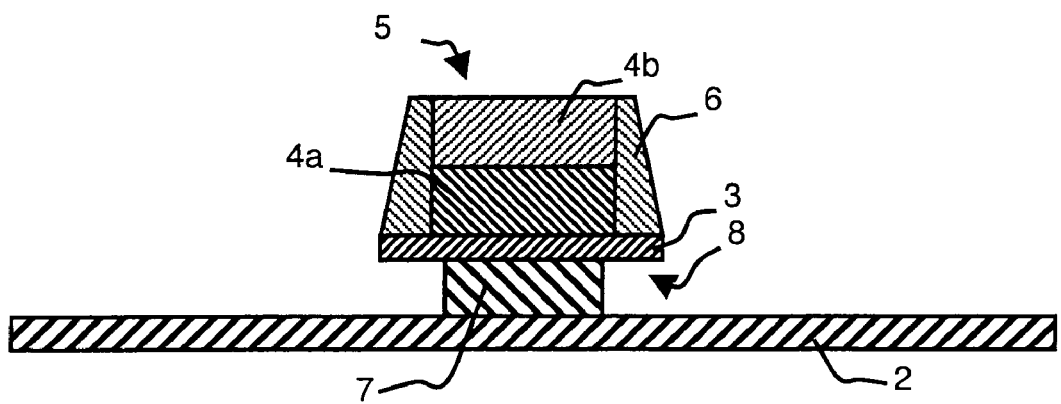

Etching of the diamond-like carbon layer 1, represented in FIG. 3, enables the channel 7 to be delineated laterally. To etch diamond-like carbon, the latter merely has to be oxidized. The $2C+O_2=2CO$ or the $C+O_2=CO_2$ reaction is fostered. A mixture of oxygen and argon can be used, acting as carrier gas and enabling the oxygen to be diluted in order to finely adjust the etching rate. The diamond-like carbon layer 1 can be etched by anisotropic or isotropic etching, as represented in FIG. 3. By isotropic etching, a removal 8 of the diamond-like carbon layer 1 is obtained underneath the gate insulating layer 3, preferably creating a retraction extending up to underneath the gate electrode 5. Isotropic etching can be performed by low-energy oxygen plasma or by means of an oxygen flow directed onto the diamond-like carbon layer 1. Anisotropic etching can be performed by reactive ion etching using an oxygen plasma. The substrate 2 can be densified by oxygen plasma at the end of etching of the diamond-like carbon layer 1.

Figure 4:
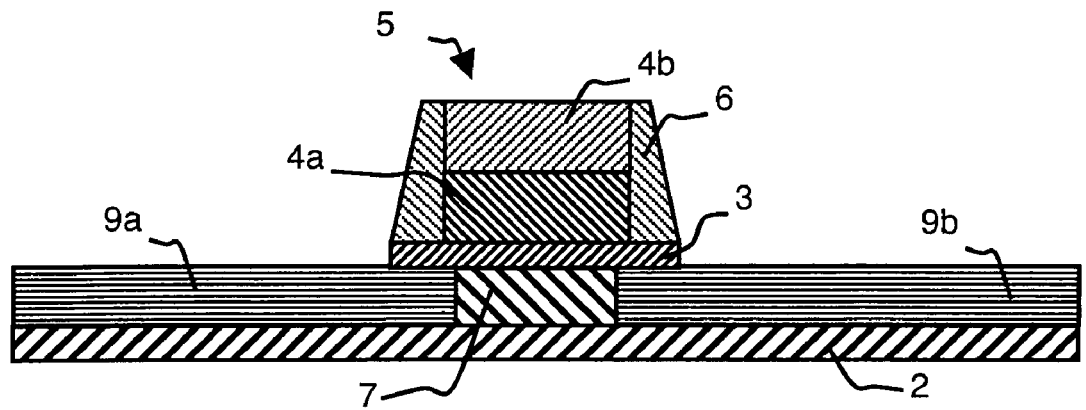

FIG. 4 represents deposition, for example by epitaxy on the substrate 2 on each side of the channel 7, of a semi-conducting material 9a and 9b designed to respectively form the source and drain.

Figure 5:
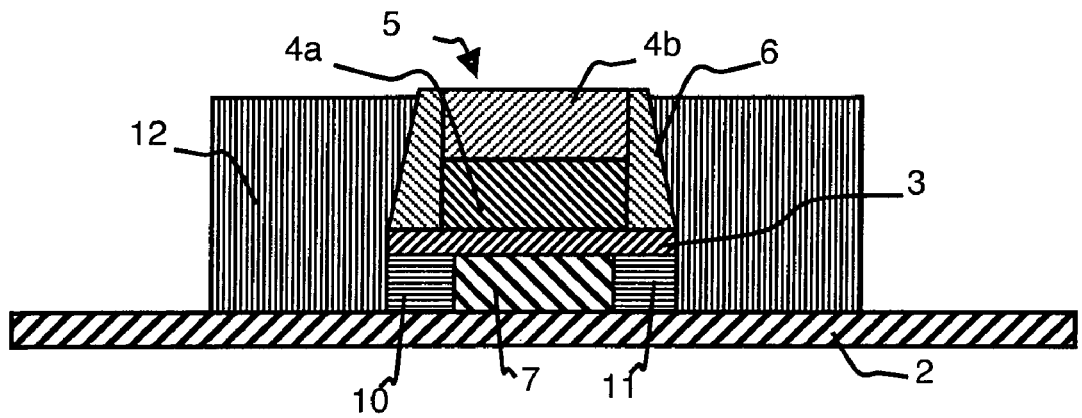

Anisotropic etching of the semi-conducting material 9a and 9b in the zones of the substrate 2 that are not covered by the gate electrode and the lateral insulator 6 enables the semi-conducting material 9a and 9b to be delineated laterally and the source 10 and drain 11 to be formed, as represented in FIG. 5. Etching of the semi-conducting material in particular enables a transistor of small size to be obtained. Fabrication of the transistor is completed by formation of contact elements connected to the source 10 and drain 11, by deposition of a metal 12 on the substrate 2, planarization, for example by mechanical-chemical means, and etching of the metal 12.

As an alternative, the source 10 and drain 11 can be made of different materials. In this case, it is possible for example to perform masking of the zone corresponding to the drain 11 during deposition of the semi-conducting material 9a designed to form the source 10, then to remove the mask, and then to mask the semi-conducting material 9a during deposition of the semi-conducting material 9b, and then remove this second mask. The materials 9a and 9b can then be etched in anisotropic manner to respectively delineate the source 10 and drain 11, as previously.

The semi-conducting material 9a can for example be diamond, forming the source 10 of a NMOS or a PMOS type transistor. The semi-conducting material 9b can for example be diamond, germanium, gallium arsenide or indium antimonide to form the drain 11 of a NMOS type transistor, and diamond or germanium to form the drain 11 of a PMOS type transistor.

The method described above in particular enables the source and drain to be automatically aligned with respect to the gate. This prevents the formation of stray capacitances between drain and gate and between source and gate, which adversely affect the performances of the transistor. Indeed, unlike the method for production according to the document U.S. Pat. No. 5,107,315 in which the source and drain are produced before the gate is produced, these steps are reversed in the method described above. The assembly formed by the gate electrode 5, the lateral insulator 6 and the corresponding part of the gate insulator 3, serves the purpose of masking to etch the diamond-like carbon layer 1 so as to delineate the channel 7. Then the source and drain are positioned around the channel, at the same level, under said assembly.

Figure 6:
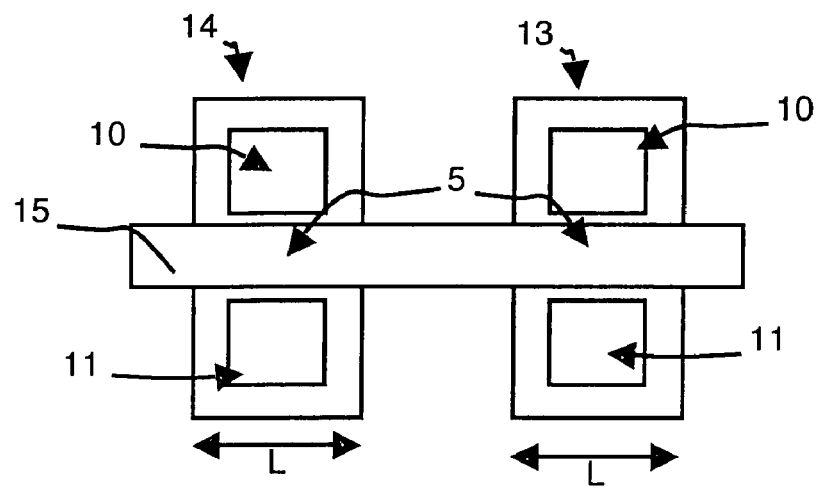
FIG. 6 schematically represents a CMOS type inverter comprising transistors according to the invention.

In FIG. 6, a PMOS type transistor 13 and a NMOS type transistor 14, forming a CMOS inverter, respectively comprise a source 10, a drain 11 and a gate electrode. Their gate electrodes 5 are connected to a common conductor 15. The PMOS and NMOS transistors have substantially the same dimensions, in particular their channel widths L are identical.

The invention claimed is:

1. Method for making a field effect transistor comprising a source and a drain connected by a channel controlled by a gate electrode separated from the channel by a gate insulator, the channel being formed in a diamond-like carbon layer, method successively comprising deposition of said diamond-like carbon layer on a substrate, deposition of an insulating gate layer on the diamond-like carbon layer, deposition, on the insulating gate layer, of at least one conducting layer and etching of the latter so as to form the gate electrode, deposition of an insulating material on flanks of the gate electrode to form a lateral insulator, etching of the gate insulating layer, etching of the diamond-like carbon layer so as to delineate the channel, in said diamond-like carbon layer, deposition, on each side of the channel, of a semi-conducting material designed to form the source and of a semi-conducting material designed to form the drain wherein etching of the diamond-like carbon layer is isotropic so as to obtain a retraction of the diamond-like carbon layer under the gate insulating layer.

2. Method according to claim 1, comprising anisotropic etching of the semi-conducting materials in the zones of the substrate not covered by the gate electrode and the lateral insulator.

3. Field effect transistor comprising a channel formed by a diamond-like carbon layer, transistor obtained by a method according to claim 1.

4. Transistor according to claim 3, wherein the channel comprises N-type dopants so as to form a PMOS type transistor.

5. Transistor according to claim 3, wherein the channel comprises P-type dopants so as to form a NMOS type transistor.

6. CMOS logic gate, comprising at least one PMOS type transistors according to claim 4 and at least one NMOS type transistor, the PMOS and NMOS type transistors having substantially the same dimensions.

7. CMOS logic gate, comprising at least one PMOS type transistor and at least one NMOS type transistor according to claim 5, the PMOS and NMOS type transistors having substantially the same dimensions.

* * * * *